United States Patent
Zhu et al.

(10) Patent No.: US 7,091,566 B2
(45) Date of Patent: Aug. 15, 2006

(54) DUAL GATE FINFET

(75) Inventors: Huilong Zhu, Poughkeepsie, NY (US); Jochen Beintner, Wappingers Falls, NY (US); Bruce B. Doris, Brewster, NY (US); Ying Zhang, Yorktown Heights, NY (US)

(73) Assignee: International Business Machines Corp., Armonk, NY (US)

( * ) Notice: Subject to any disclaimer, the term of this patent is extended or adjusted under 35 U.S.C. 154(b) by 135 days.

(21) Appl. No.: 10/717,737

(22) Filed: Nov. 20, 2003

(65) Prior Publication Data

US 2005/0110085 A1   May 26, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/401; 257/318; 257/319; 257/320; 257/324; 257/326; 257/328; 257/347; 257/365; 257/618; 257/619; 257/623; 257/E29.264; 257/E29.319

(58) Field of Classification Search ........ 257/618–619, 257/623, 365, 318–320, 324, 326, 328, 347, 257/401, E29.264, E29.319
See application file for complete search history.

(56) References Cited

U.S. PATENT DOCUMENTS

| | | | | |
|---|---|---|---|---|
| 5,315,143 A * | 5/1994 | Tsuji | ............................ | 257/351 |
| 5,929,480 A * | 7/1999 | Hisamune | .................... | 257/320 |
| 5,982,004 A * | 11/1999 | Sin et al. | ..................... | 257/347 |
| 6,268,622 B1 * | 7/2001 | Shone et al. | ................. | 257/314 |
| 6,281,545 B1 * | 8/2001 | Liang et al. | ................. | 257/315 |
| 6,291,855 B1 * | 9/2001 | Chang et al. | ............... | 257/316 |
| 6,313,500 B1 * | 11/2001 | Kelley et al. | ............... | 257/316 |
| 6,391,695 B1 * | 5/2002 | Yu | .............................. | 438/166 |
| 6,433,609 B1 * | 8/2002 | Voldman | ..................... | 327/313 |
| 6,458,662 B1 * | 10/2002 | Yu | .............................. | 438/286 |
| 6,504,207 B1 * | 1/2003 | Chen et al. | .................. | 257/319 |
| 6,580,132 B1 * | 6/2003 | Chan et al. | .................. | 257/365 |
| 6,747,310 B1 * | 6/2004 | Fan et al. | .................... | 257/320 |
| 6,809,374 B1 * | 10/2004 | Takamura | .................... | 257/324 |
| 6,831,310 B1 * | 12/2004 | Mathew et al. | ............. | 257/270 |
| 6,888,199 B1 * | 5/2005 | Nowak et al. | ............... | 257/347 |
| 6,903,967 B1 * | 6/2005 | Mathew et al. | ............. | 365/177 |
| 6,911,383 B1 * | 6/2005 | Doris et al. | .................. | 438/588 |
| 6,946,696 B1 * | 9/2005 | Chan et al. | .................. | 257/250 |
| 6,960,806 B1 * | 11/2005 | Bryant et al. | ............... | 257/330 |
| 2003/0151077 A1 * | 8/2003 | Mathew et al. | ............. | 257/250 |

(Continued)

OTHER PUBLICATIONS

Zhang et al., Low-Power High-Performance Double-Gate Fully Depleted SOI Circuit Design, IEEE Transactions on Eledtron Devices, May 2, 2003, Publisher: IEEE, Published in: US.

*Primary Examiner*—Ida M. Soward
(74) *Attorney, Agent, or Firm*—Law Office of Charles W. Peterson, Jr.; Wan Yee Chung, Esq.

(57) ABSTRACT

A field effect transistor (FET), integrated circuit (IC) chip including the FETs and a method of forming the FETS. Each FET includes a device gate along one side of a semiconductor (e.g., silicon) fin and a back bias gate along an opposite of the fin. Back bias gate dielectric differs from the device gate dielectric either in its material and/or thickness. Device thresholds can be adjusted by adjusting back bias gate voltage.

31 Claims, 13 Drawing Sheets

U.S. PATENT DOCUMENTS

| | | | |
|---|---|---|---|
| 2003/0178670 A1* | 9/2003 | Fried et al. | 257/315 |
| 2004/0161886 A1* | 8/2004 | Forbes et al. | 438/198 |
| 2004/0174734 A1* | 9/2004 | Forbes | 365/149 |
| 2004/0219722 A1* | 11/2004 | Pham et al. | 438/157 |
| 2005/0017377 A1* | 1/2005 | Joshi et al. | 257/903 |
| 2005/0023619 A1* | 2/2005 | Orlowski et al. | 257/401 |
| 2005/0029583 A1* | 2/2005 | Popp et al. | 257/329 |
| 2005/0051812 A1* | 3/2005 | Dixit et al. | 257/250 |
| 2005/0059252 A1* | 3/2005 | Dokumaci et al. | 438/706 |

* cited by examiner

DUAL GATE FINFET

BACKGROUND OF THE INVENTION

1. Field of the Invention

The present invention is related to semiconductor devices and manufacturing and more particularly to field effect transistors (FETs) formed on silicon on insulator (SOI) wafers and methods of manufacturing FETs and circuits on SOI wafers.

2. Background Description

Semiconductor technology and chip manufacturing advances have resulted in a steady increase of on-chip clock frequencies, the number of transistors on a single chip and the die size itself, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, must be achieved without degrading performance below acceptable levels.

To minimize power consumption, most integrated circuits (ICs) used in such low end systems (and elsewhere) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_T$) with respect to its source, the NFET is off, i.e., the switch is open. Above $V_T$, the NFET is on conducting current ($I_{on}$), i.e., the switch is closed. Similarly, a PFET is off ($I_{off}$=0) when its gate is above its $V_T$, i.e., less negative, and on below $V_T$. Thus, ideally, the CMOS inverter in particular and CMOS circuits in general pass no static (DC) current. So, ideally, device on to off current ratios ($I_{on}/I_{off}$) are very large and, ideal CMOS circuits use no static or DC power, consuming only transient power from charging and discharging capacitive loads.

In practice however, transient power for circuit loads accounts for only a portion of the power consumed by CMOS circuits. A typical FET is much more complex than a switch. FET drain to source current (and so, power consumed) is dependent upon circuit conditions and device voltages. FETs are known to conduct what is known as subthreshold current below threshold for NFETs and above for PFETs. Subthreshold current increases with the magnitude of the device's drain to source voltage ($V_{ds}$) and inversely with the magnitude of the device $V_T$. Among other things, $V_T$ is inversely proportional to gate oxide thickness and, to some extent channel length, both of which are related to feature size. In addition, gate leakage, to channel, to source or drain and gate induced drain leakage (GIDL) can also contribute to static power and are also related in particular to oxide thickness. Thus, as chip features shrink, these leakage sources become more predominant. This is especially true in what is known as partially depleted (PD) silicon on insulator (SOI) technology, where subthreshold leakage has been shown to increase dramatically, such that it may be the dominant source of leakage. When multiplied by the millions and even billions of devices on a state of the art IC, even 100 picoAmps (100 pA) of leakage in each devices, for example results in chip leakage on the order of 100 milliAmps (100 mA). So, increasing device thresholds reduces subthreshold leakage and other short channel effects. Unfortunately, however, increasing device thresholds also impairs performance. Fin shaped FETs (FinFETs) are known to have better short channel effect control than partially depleted SOI FETs and it is easier to manufacture dual gate FinFETs than planar fully depleted double gate FETs. However, FinFET channels are too thin and too short for consistent channel tailoring (i.e., fin doping fluctuates unacceptably) and so, consistent FinFET thresholds have not heretofore been attainable.

Thus, there is a need for improved $V_T$ adjustment to achieve better leakage control, steeper subthreshold slopes and increased device on to off current ratios.

SUMMARY OF THE INVENTION

It is a purpose of the invention to improve device on to off current ratios;

It is another purpose of the invention to improve device subthreshold slopes;

It is yet another purpose of the invention to improve device leakage control.

The present invention relates to a field effect transistor (FET), integrated circuit (IC) chip including the FETs and a method of forming the FETS. Each FET includes a device gate along one side of a semiconductor (e.g., silicon) fin and a back bias gate along an opposite of the fin. Back bias gate dielectric differs from the device gate dielectric either in its material and/or thickness. Device thresholds can be adjusted by adjusting back bias gate voltage.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
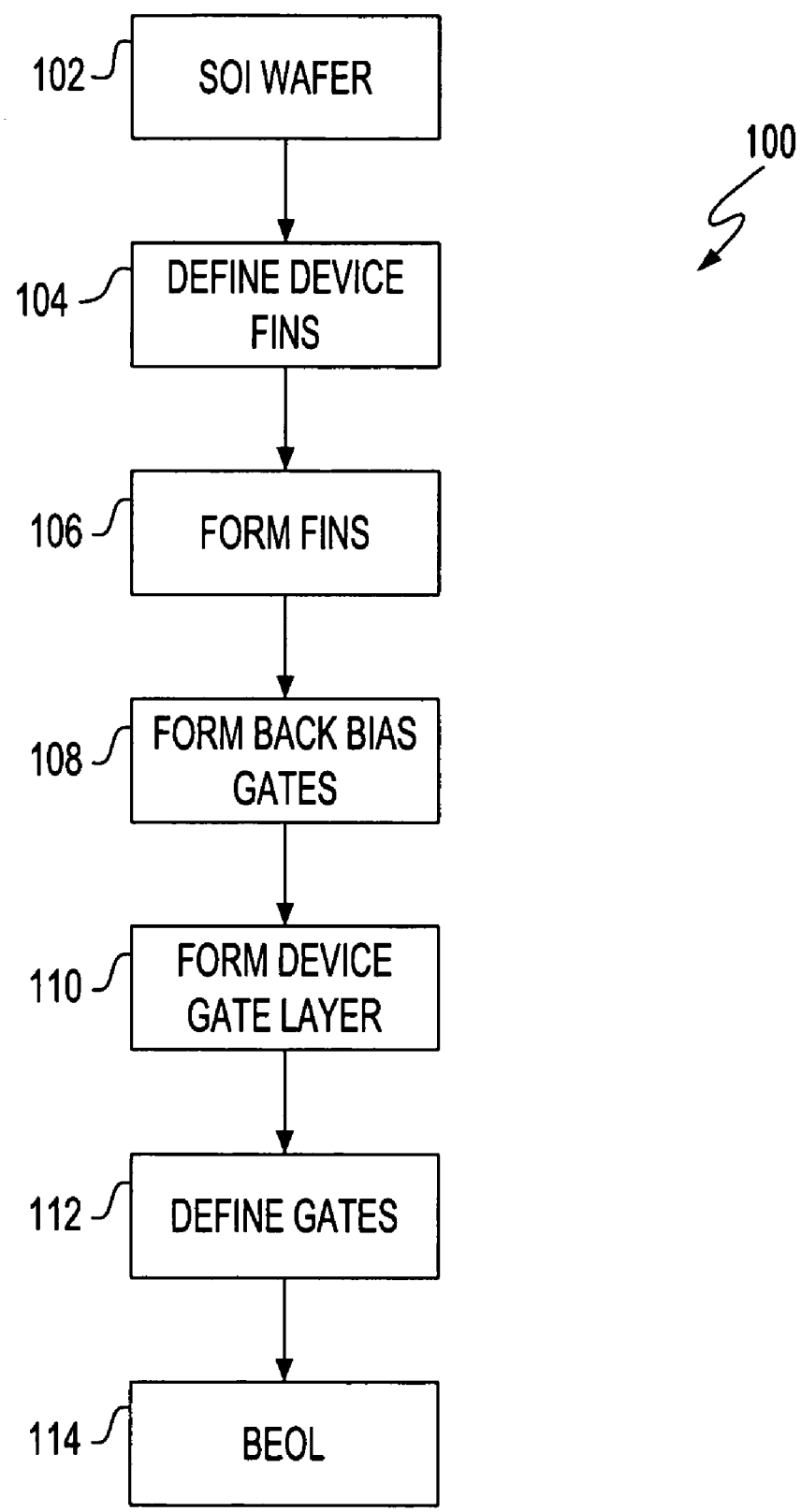
FIG. 1 shows an example of a preferred embodiment method for forming field effect transistors (FETs)

Turning now to the drawings and, more particularly, FIG. 1 shows an example of a preferred embodiment method for forming dual gate field effect transistors (FETs), e.g., in an integrated circuit (IC) and, more particularly FinFETs, according to the present invention. Further, one gate of preferred embodiment dual gate FinFETs may be used to adjust the thresholds for the other, i.e., operating to effectively back bias the device for the other, normal device gate. So, circuit/device formation begins in step 102 with a typical semiconductor wafer preferably, a silicon on insulator (SOI) wafer. Then in step 104 device fins are defined and in step 106 formed from an upper surface semiconductor layer, e.g., a silicon layer. Then, in step 108, a back bias gate is formed along a back side of the device fins. In step 110 a conductive gate layer is formed over the wafer including over device fins and back bias gates. In step 112, the gate layer is patterned to define gates, i.e., divide the gate layer to separate device gates from back bias gates. Thereafter in step 114, device definition (e.g., source drain formation) and processing continues, forming source/drain diffusions and with normal back end of the line (BEOL) steps, e.g., wiring devices together and wiring circuits to pads and off chip.

FIGS. 2A–L show a cross section 120 of an example of forming preferred embodiment FinFETs according to the example of FIG. 1. Thus, device formation begins in step 102 as is shown in the cross section of FIG. 2A with a layered wafer 120, preferably, a SOI wafer. The upper layers 122, 124 are shown in this example, an insulator layer which is a buried oxide (BOX) layer 122 in this example and a semiconductor layer 124 which is a silicon layer on the BOX layer 122. Semiconductor layer 124 can be a layer of Si, Ge, SiGe, SiC, or any other suitable semiconductor material or combination thereof including a material from the III-V group of semiconductor materials. Device formation in step 104 begins in FIG. 2B by forming an insulator layer 126 on the surface silicon layer 124. Then, a sacrificial layer 128 is formed on the insulator layer 126. Preferably, the second insulator layer 126 is a 5–10 nanometers (5–10 nm) oxide layer and the sacrificial layer 128 is a polysilicon germanium (poly-SiGe) layer, preferably, 60–100 nm thick. A positive resist layer is formed on the sacrificial layer 128 and patterned using well known photolithographic patterning techniques to form a positive resist pattern 130.

Figure 2A:
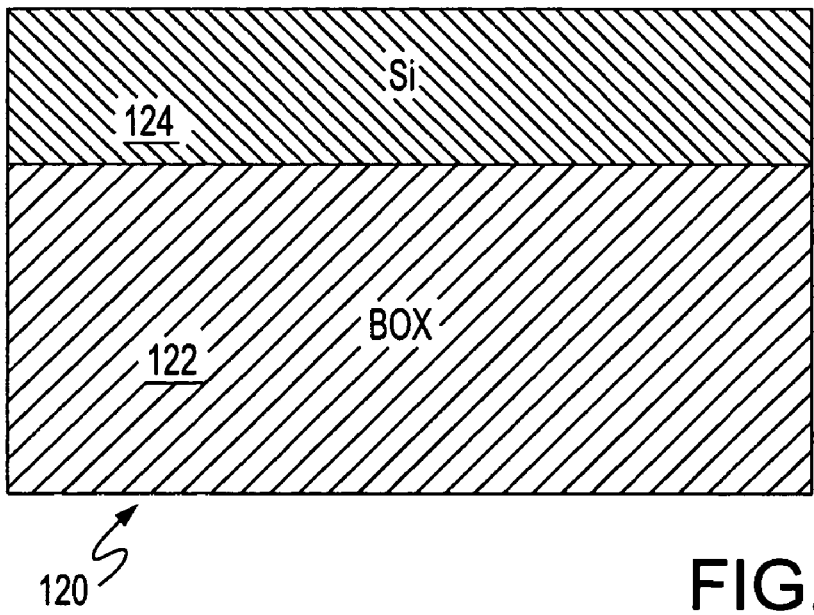
FIGS. 2A–L shows an example of forming FinFETs according to the first example of FIG. 1.
Figure 2B:
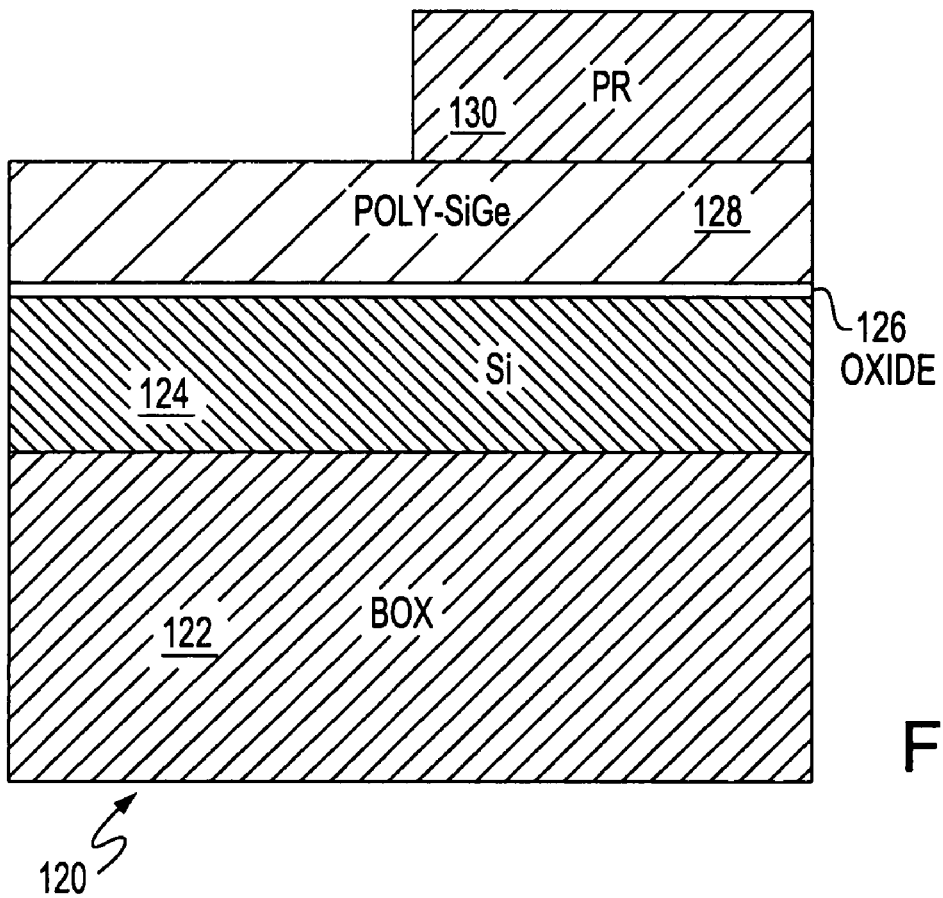
Figure 2C:
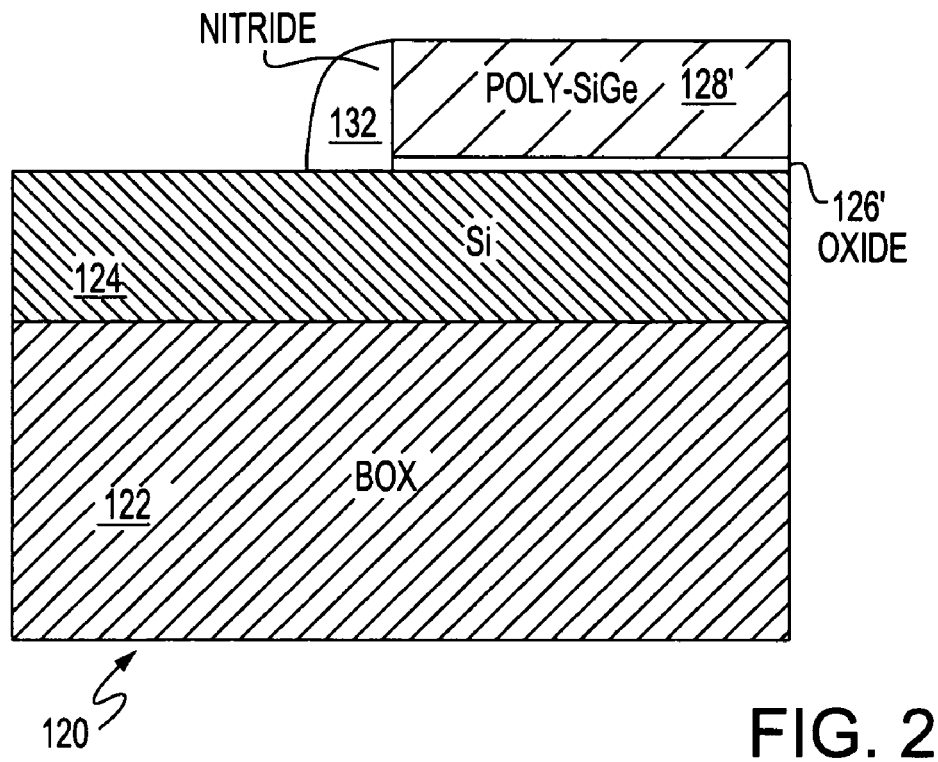

Next, as shown in FIG. 2C, using a suitable etchant that is selective to the surface layer 124 material, exposed portions of sacrificial layer 128 and insulator 126 are removed, re-exposing and stopping on the surface silicon layer 124. An insulator layer, preferably, nitride is conformally formed over the wafer and then etched isotropically to leave a nitride pillar 132, preferably 60–70 nm thick, along side remaining sacrificial layer portions 128' and insulator layer portions 126'. The isotropic etch re-exposes portions of the surface semiconductor layer 124. Fin formation begins in step 106 by using an appropriate etchant to selectively remove the exposed portion of surface semiconductor material 124 to the buried oxide (BOX) layer 122.

Figure 2D:
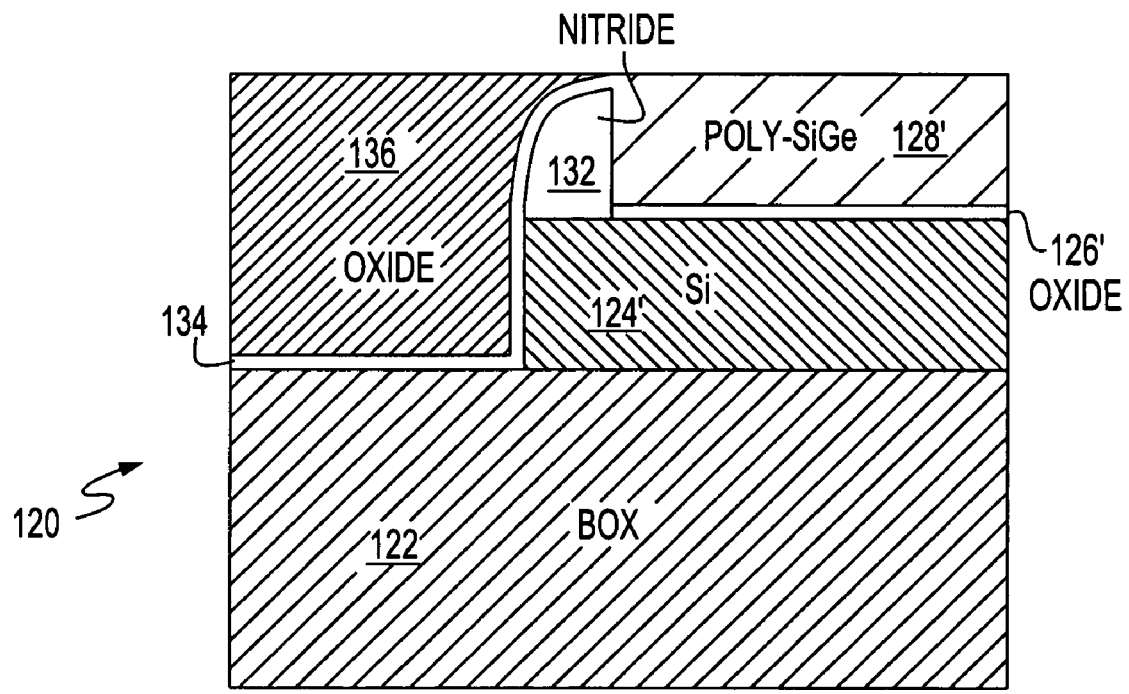

Continuing step 106 in FIG. 2D, a thin (10 nm) layer 134, e.g., of the same material as is deposited conformally over the wafer. In particular, the thin layer 134 forms along the exposed surface of oxide layer 122 and extends upward along the sidewall of the surface seminconductor layer portions 124' and along the nitride pillars 132 merging with sacrificial layer portions 128'. Then, a fill, preferably an oxide fill, is selectively formed (e.g., deposited) and the surface is planarized (e.g., chemical mechanical polishing (CMP) or etching to stop on poly-SiGe or nitride), such that oxide 136 remains where the portions of the surface silicon layer and the upper silicon layer were previously removed.

Figure 2E:
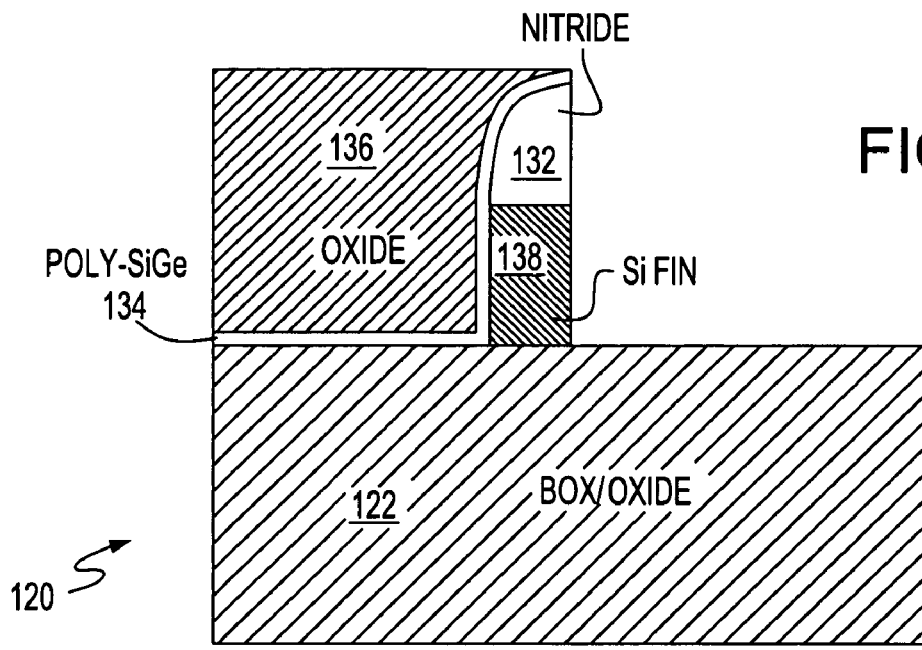

Next, in FIG. 2E a suitable etchant(s) is/are used to remove the sacrificial layer portions 128' as well as insulator layer portions 126' and surface semiconductor layer portions 124' therebelow. So, for example, poly-SiGe layer portions 128' can be etched, e.g., with a reactive ion etch (RIE). Then, the exposed insulator layer 126' is removed, e.g., with a suitable wet etch. Finally, the exposed portion of surface semiconductor layer 124' is removed, e.g., using a suitable isotropic etch such as a RIE, which defines silicon fins 138. It should be noted that FinFET width is the height of the particular fin 138 and FinFET length is the length of the fin 138 less source/drain diffusion (not shown) at either end of the fin 138. Optionally, at this point the fins may be doped with an angled implant for channel tailoring; although, the back bias gate may sufficiently stet the channel $V_T$.

Figure 2F:
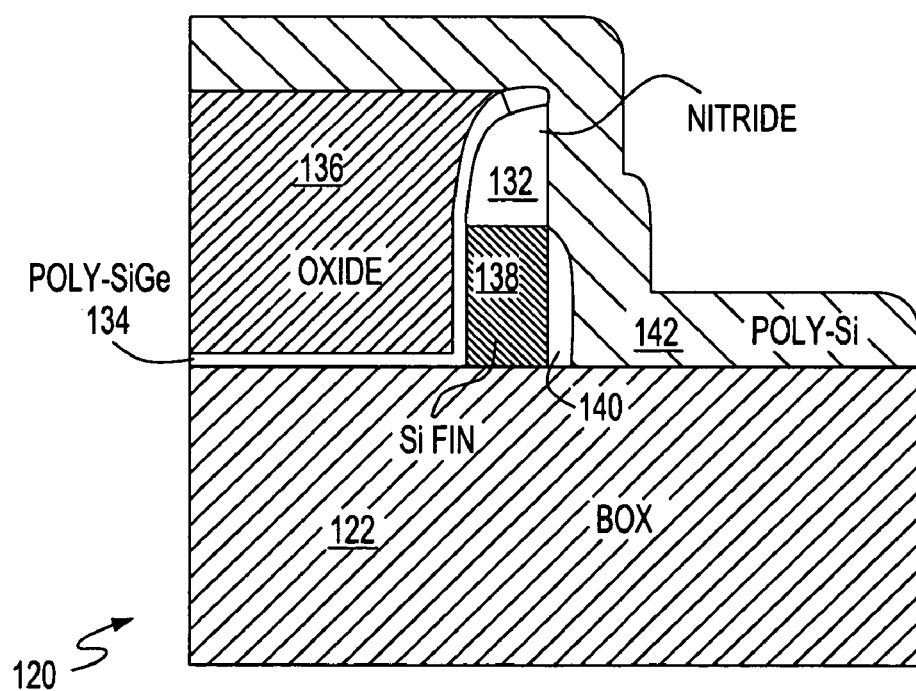
Figure 2G:
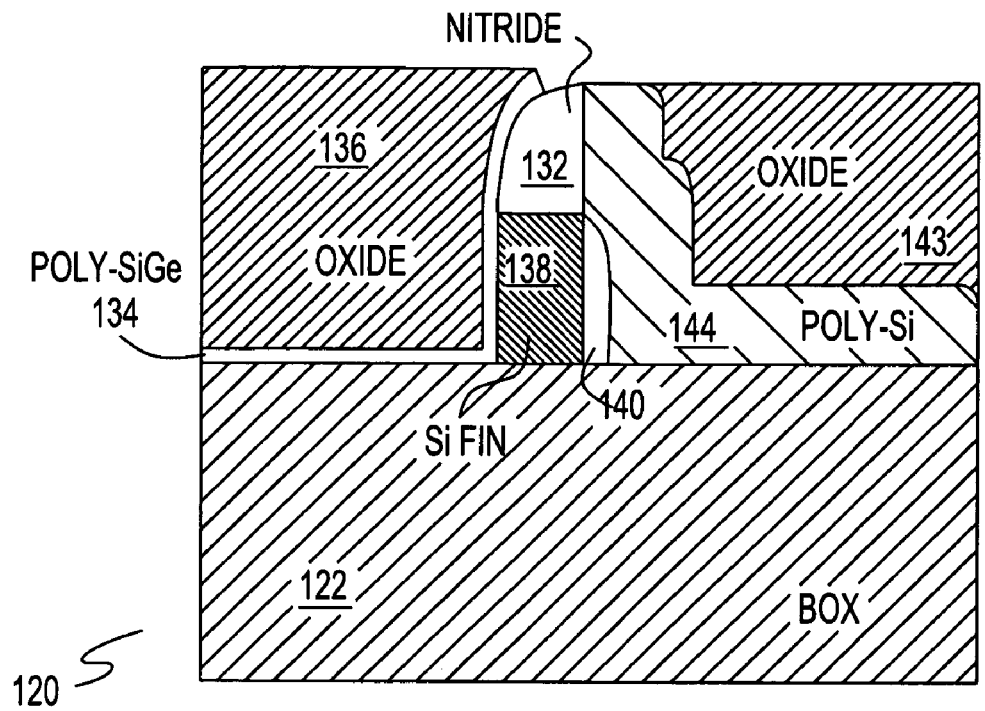
Figure 2H:
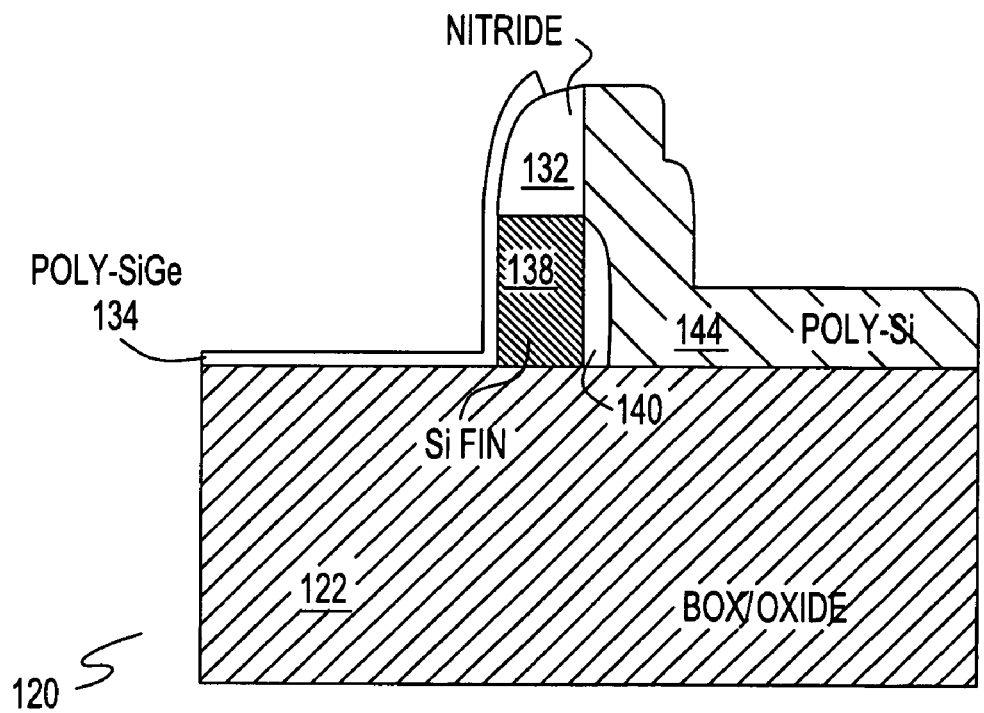

Next, in step 108 as shown in FIG. 2F, back bias gates are formed. First, a back bias gate dielectric 140, e.g., oxide, is formed along the exposed sidewall of each of the semiconductor fins 138. Preferably, a 0.6 nm to 6.0 nm thick gate dielectric is formed using a suitable semiconductor silicon oxide growth technique such as thermal oxidation. The back bias gate dielectric 140 may be, for example, an oxide, an oxynitride or any suitable high K dielectric material or combination thereof. Next, a layer of conductive material layer 142, e.g., polysilicon, is formed over the surface, e.g., using poly deposition. Then, as shown in FIG. 2G, the polysilicon layer 142 is patterned using a suitable patterning technique and separated from thin sacrificial layer 134 to form back bias gates 144 alongside the fins 138 at the back bias gate dielectric 140. So, the polysilicon layer 142 may be patterned, for example, forming an oxide fill and planarizing with CMP and stopping on nitride, i.e., at the nitride pillars 132 to define the back bias gates. The remaining oxide 136, 143 is removed as shown in FIG. 2H to re-expose the thin sacrificial layer 134 and back bias gates 144.

Figure 2I:
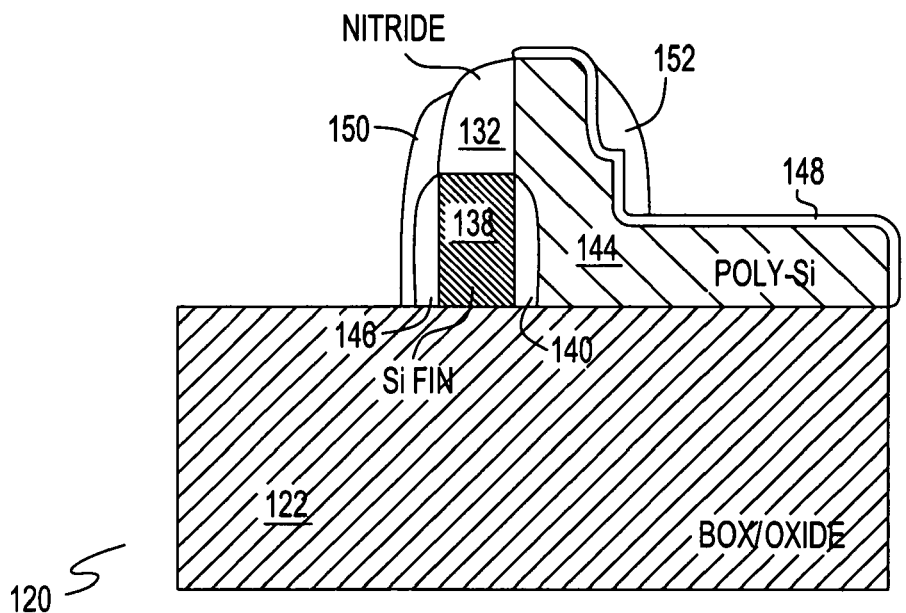
Figure 2J:
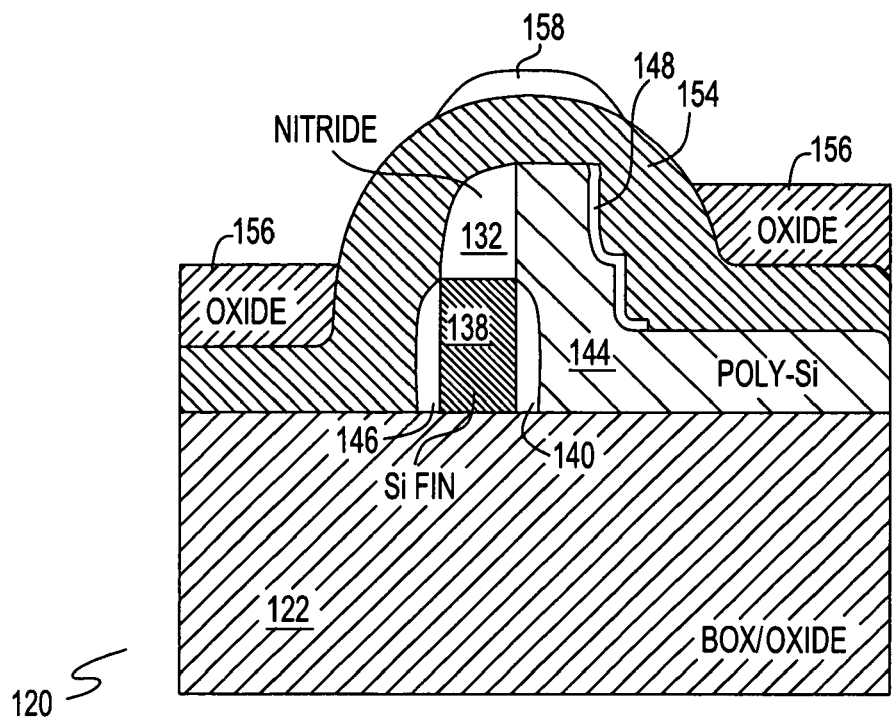

Device gate formation begins in step 110 as shown in FIG. 2I with removal of remaining portions of thin sacrificial layer 134 and formation of a 0.6 nm to 2.0 nm thick device gate dielectric or oxide 146. It should be noted that the back bias gate dielectric 140 may differ from the device gate dielectric 146 in its thickness or material, or both, with the particular combination being selected dependent on the specific application or desired device performance. If the gate dielectric materials are the same (i.e., same dielectric constant), then it is preferable that the back bias gate dielectric be thicker than that of the device gate dielectric 146. In one embodiment, the back bias gate dielectric 140 is five times (5×) thicker than the device gate oxide (e.g., 5 nm to 1 nm, respectively) and is an oxide formed by deposition or thermal oxidation. Since thermal oxide forms on silicon, device gate oxide 146 forms along the opposite side (from the back bias gates) of the fins 132 and BOX layer 122 thickens slightly. Optionally, the device gate dielectric 146 may be an oxynitride or any suitable high K dielectric material, e.g., tantalum pentoxide ($Ta_2O_5$), barium titanate ($BaTiO_3$) and titanium oxide ($TiO_2$). Coincidentally, a thin oxide layer 148 forms along the exposed surface of the back bias gate 144. Then, a thin gate material (e.g., polysilicon) layer is conformally formed on the wafer and isotropically etched, e.g., RIE, to leave thin conductive (polysilicon) spacers 150, 152 on either side of the fins 138 and, coincidentally, expose horizontal areas and, in particular, the horizontal portions of oxide layer 148 on the back bias gates 144. Next, the exposed thin oxide layer 148 portions are removed, e.g., using a suitable etchant, to re-expose horizontal surfaces of the back bias gates 144. Then, spacers 150, 152 and exposed horizontal portions of the back bias gates 144 may be cleaned, e.g., using hydrofluoric acid (HF) to remove native oxide. In FIG. 2J, a gate layer is formed on the wafer, e.g., deposited or epitaxially grown. The gate layer is preferably, a layer of polysilicon, the same material as the conductive spacers 150, 152. So, the gate layer forms a uniform polysilicon layer 154 with the polysilicon spacers 150, 152. Then, oxide is selectively directionally deposited, such that oxide forms on horizontal, but not vertical surfaces of layer 154. In particular, oxide 156 forms at either side of the fins and, depending upon the curvature of the nitride pillar 132, much thinner oxide 158 (⅓–½ as thick as oxide 156) forms above the fins 138.

Figure 2K:
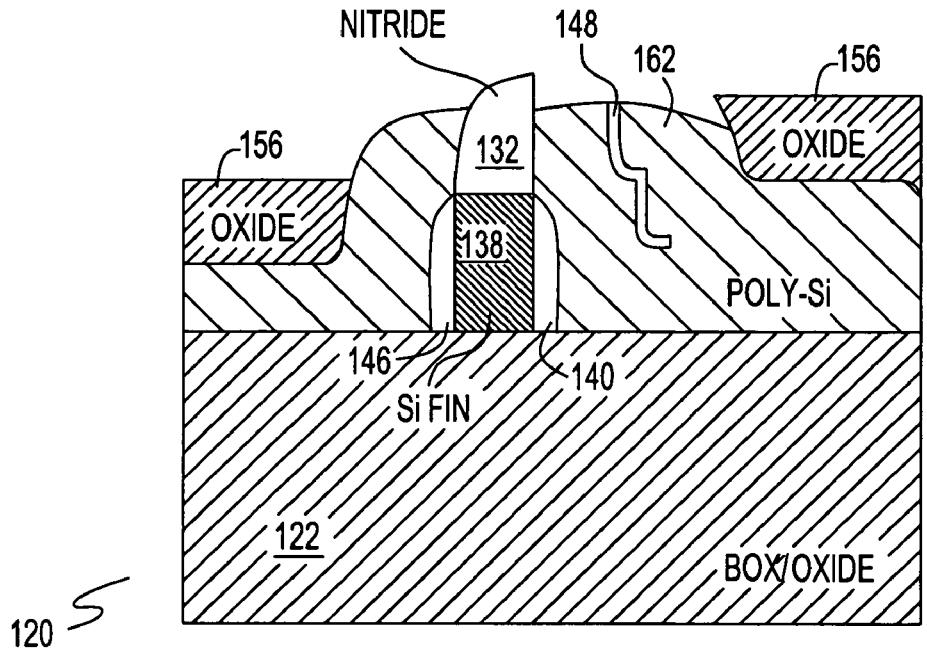
Figure 2L:
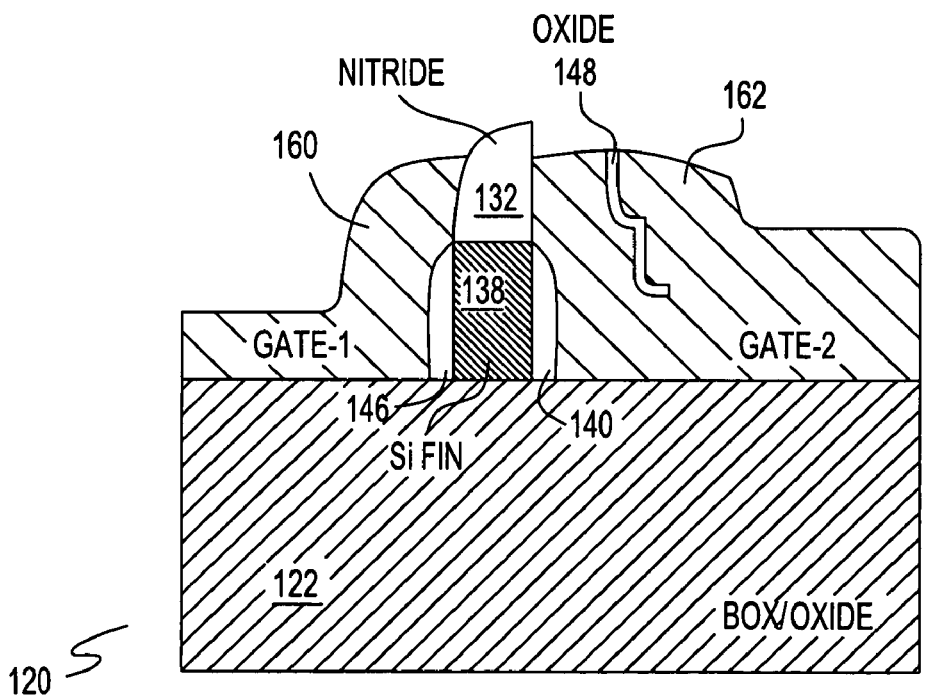

As shown in FIG. 2K, portions of the polysilicon layer 154 is removed to re-expose the nitride pillar 132 and separate the device gate 160 from the back bias gate 162. So, using a wet etch, for example, in a typical masking step the oxide 158 above the fins 138 may be selectively removed above the fins 138 and then, e.g., using RIE, the uniform polysilicon layer 154 may be etched to separate the device gate 160 from the back bias gate 162. Since a typical RIE has a thickness control of ~20 nm, the nitride pillars 172 must be tall enough (preferably, 60–70 nm) so that etching may be stopped before the gate layer etches below the nitride pillars 132 and, possibly below the upper channel side, i.e., at the upper edges of the gate dielectric 146 and/or the back bias gate dielectric 140. Alternately, oxide 158 and overlying portions of uniform layer 154 may be removed, first using a CMP, stopping on the uniform polysilicon layer 154 or at the nitride pillars 132 and, then, following with an etch to separate the gates 160, 162. As is shown in FIG. 2L, the remaining oxide 156 is removed and device definition (e.g., source drain formation) and processing continues with normal back end of the line steps, wiring devices together and wiring circuits to pads and off chip. In particular, device source and drain regions (not shown) are formed at either end of the fins 138 and perpendicular to the cross section of FIGS. 2A–L, i.e., in front of and behind the Figures.

FIGS. 3A–K show a second example of forming preferred embodiment dual gate FinFETs according to the present invention. In this embodiment, unless specifically indicated otherwise, all materials and dimensions are substantially the same as in the embodiment of FIGS. 2A–L. So, the layered wafer 170 provided in step 102 includes base dielectric or substrate layer 172 and a layered dielectric 174, 176 on the substrate layer 172. Preferably, the upper dielectric (e.g., oxide) layer 176 is substantially the same thickness as the intended gate dielectric layer. Also, preferably, the middle dielectric (e.g., nitride) layer 174 is thick enough that the sum of both dielectric layers 174, 176 is substantially the same as the back bias gate dielectric layer. The layered wafer 170, which includes a semiconductor (e.g., silicon) layer 178 on the upper dielectric layer 176, may be a bonded wafer or, formed using any other suitable technique for forming such a wafer.

Figure 3A:
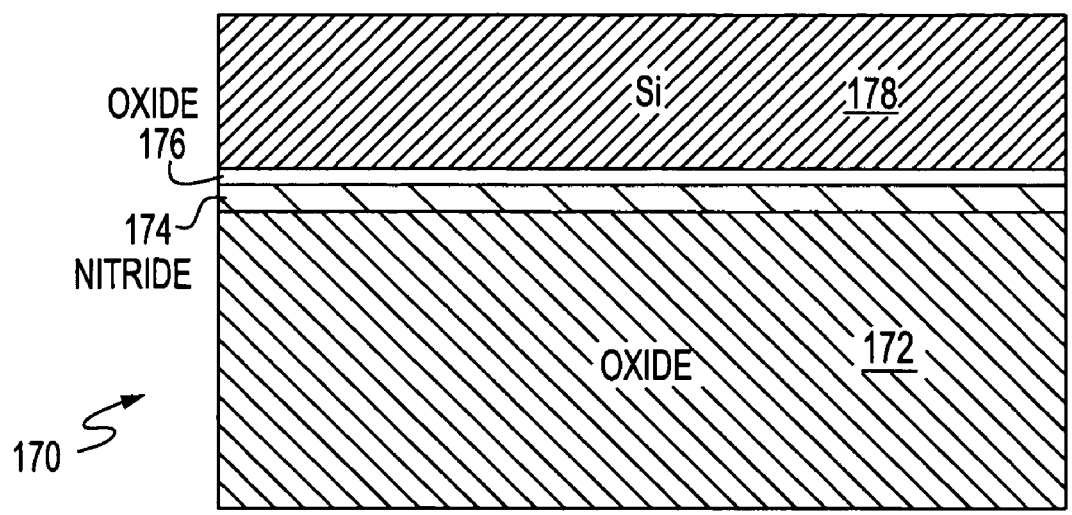
FIGS. 3A–K show a second example of preferred embodiment FinFETs of the present invention.
Figure 3B:
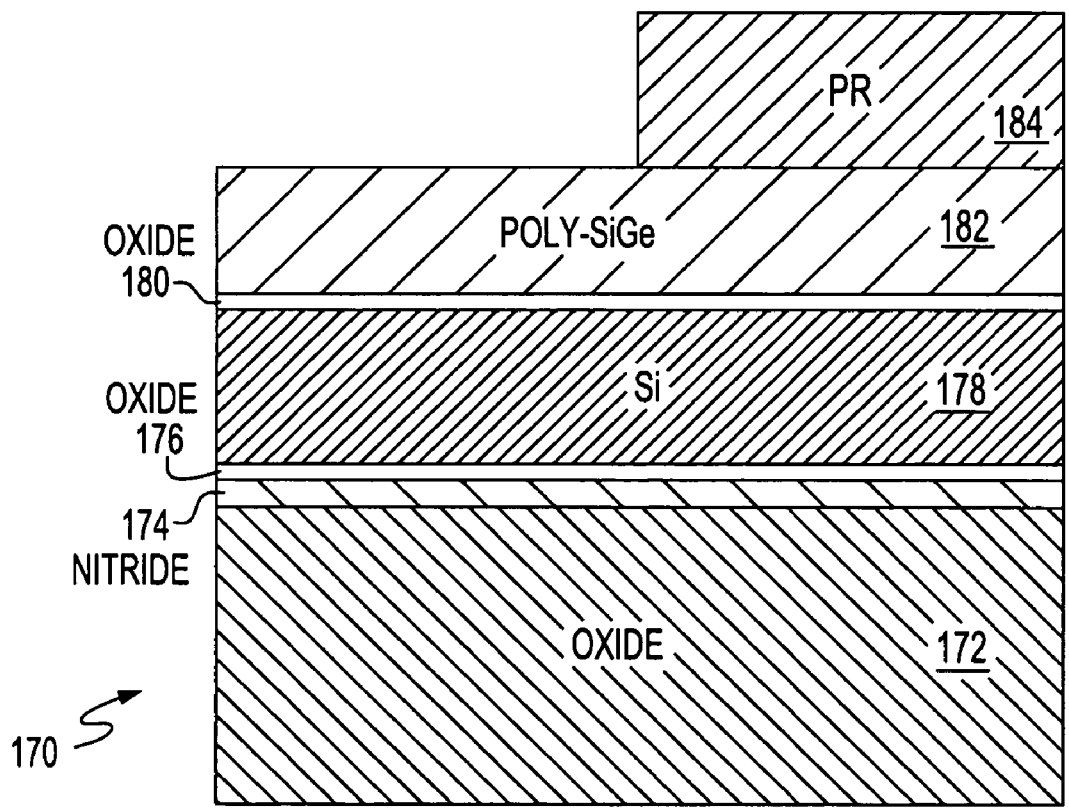
Figure 3C:
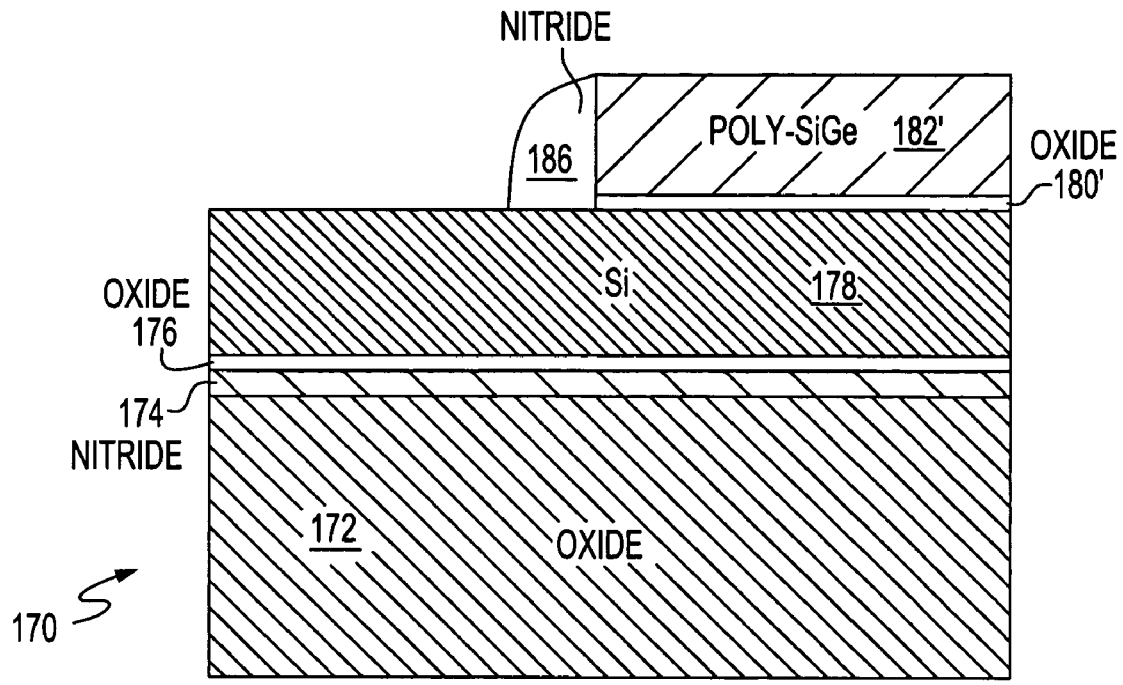

Step 104 of defining device fins begins in FIG. 3B by forming a thin dielectric (e.g., oxide) layer 180 on silicon layer 178. Then, a sacrificial (e.g., poly-SiGe) layer 182 is formed on the oxide layer 180. A positive resist mask 184 is formed and patterned on the sacrificial layer 182. Again, using a typical etchant, exposed portions of the sacrificial layer 182 are removed along with portions of the underlying thin dielectric layer 180. Then, as shown in FIG. 3C, nitride pillars 188 are formed as described above along the sidewalls of patterned sacrificial layer 184' and thin dielectric layer 182'.

Figure 3D:
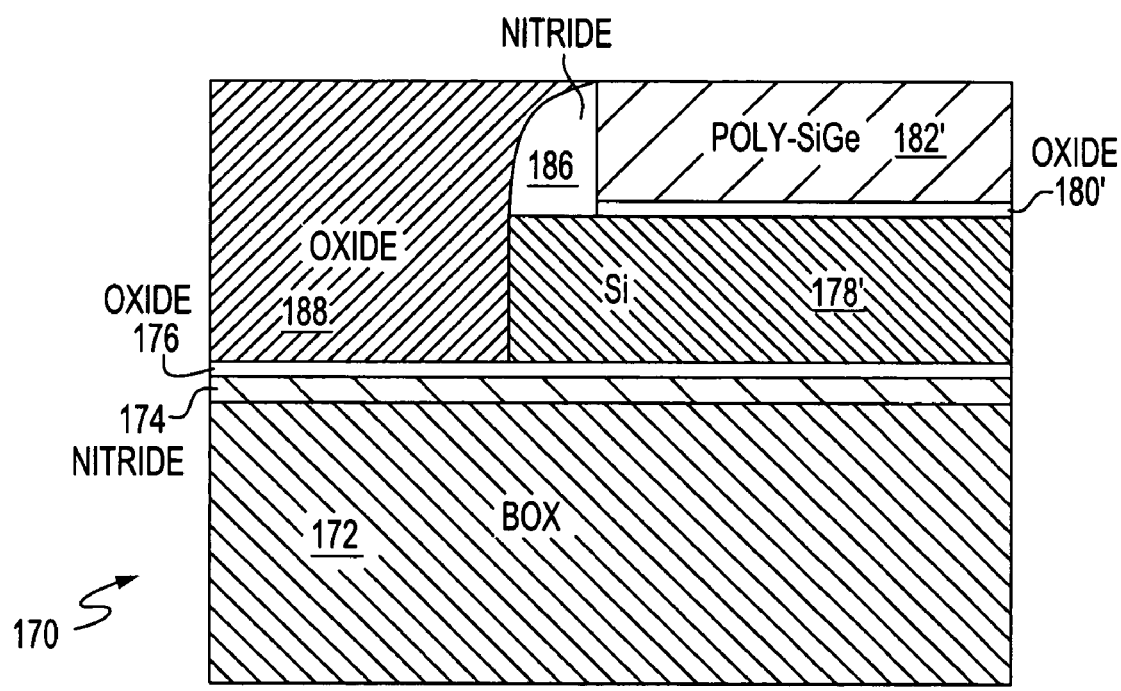
Figure 3E:
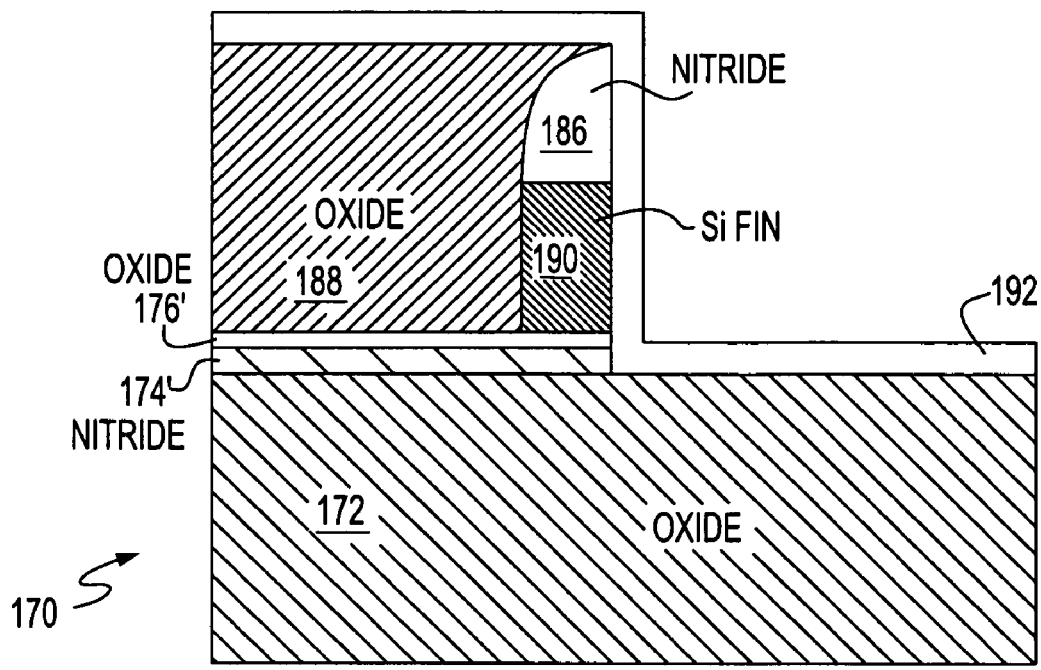

Next, fin formation begins in step 106 as shown in FIG. 3D by etching the exposed portions of surface silicon layer 178 to upper dielectric layer 176. Then, fill material (e.g., oxide) 188 is deposited and planarized, e.g., using CMP, to the sacrificial layer 182'. The remaining sacrificial layer portion 184' is stripped away to expose the underlying dielectric material layer 182'. Then, using a suitable etchant, the exposed portions of dielectric material layer 182' are removed, which partially exposes underlying semiconductor surface layer portions 178' and may slightly etch fill material 188. Then as shown in FIG. 3E, using the nitride pillars 186 as a mask, exposed portions of the semiconductor layer 178' are isotropically etched, e.g., using RIE, to leave semiconductor fins 190. The exposed portion of upper dielectric layer 176 is etched, also slightly etching fill material 188 and leaving upper dielectric layer portion 176'. Next, the exposed portion of middle dielectric layer 174 is removed leaving nitride 174' and exposing subsurface oxide layer 172. Again, optionally, at this point the fins may be doped with an angled implant for channel tailoring. Finally, the back bias gate dielectric layer 192 is grown conformally using a suitable oxide, oxynitride or high K dielectric, preferably $HfO_2$ and/or $ZrO_2$.

Figure 3F:
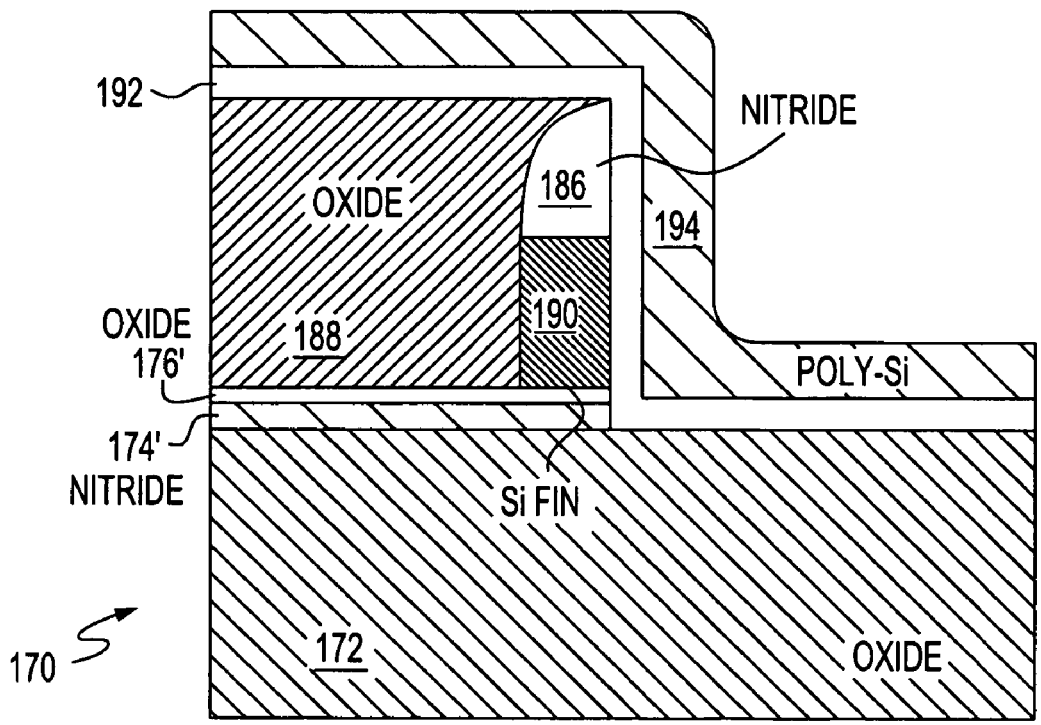
Figure 3G:
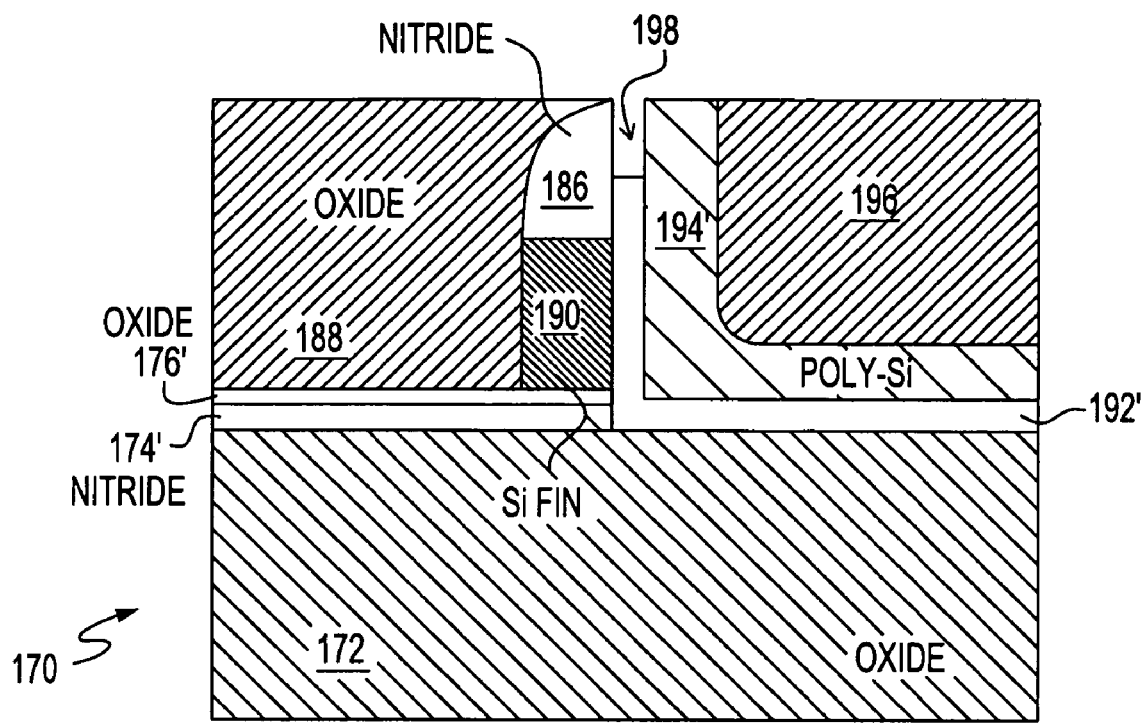
Figure 3H:
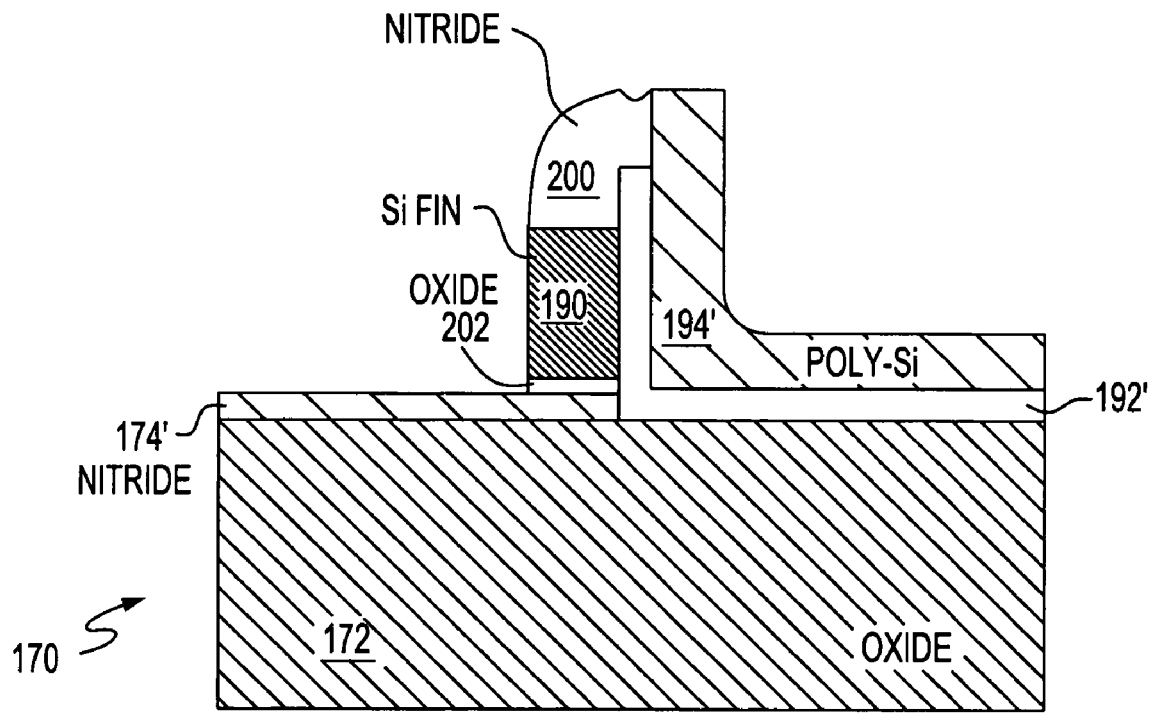

Back bias gate formation in step 108 begins in FIG. 3F, when a back bias gate (e.g., polysilicon) layer 194 is conformally deposited on the back bias gate dielectric layer 192. Fill material, e.g., oxide, is deposited on or formed on the wafer and planarized to the back bias gate layer 194, e.g., using CMP and stopping on the back bias gate layer 194, leaving fill 196 in FIG. 3G. Then, the exposed surface of the back bias gate layer 194 is removed to the upper edge of the nitride pillars 186 using a suitable etchant. A suitable etchant is used to remove the exposed portion of back bias gate dielectric layer 192 and, partially, etching below the upper edge of the polysilicon 194' forming a void 198 between the nitride pillars 186 and back bias gate layer 194'. Optionally, the CMP may continue through the back bias gate layer 194 and back bias gate dielectric layer 192 removing horizontal portions of both, followed by a short etch to form voids 198. Next, as shown in FIG. 3H, voids 198 are plugged with nitride (e.g., nitride deposition) above the gate dielectric 196' to form caps 200. Then, the fill 188, 196 is stripped away, e.g., with an etch selective to the middle dielectric layer 174 and to back bias gate material. Preferably, the fill material is the same as dielectric layer 176'. So, exposed portions of dielectric layer 176' are removed coincident with stripping away the fill material 198, exposing the remaining portions of middle dielectric layer 174'. As a result, the fins 190 reside on a small upper dielectric pad 202.

Figure 3I:
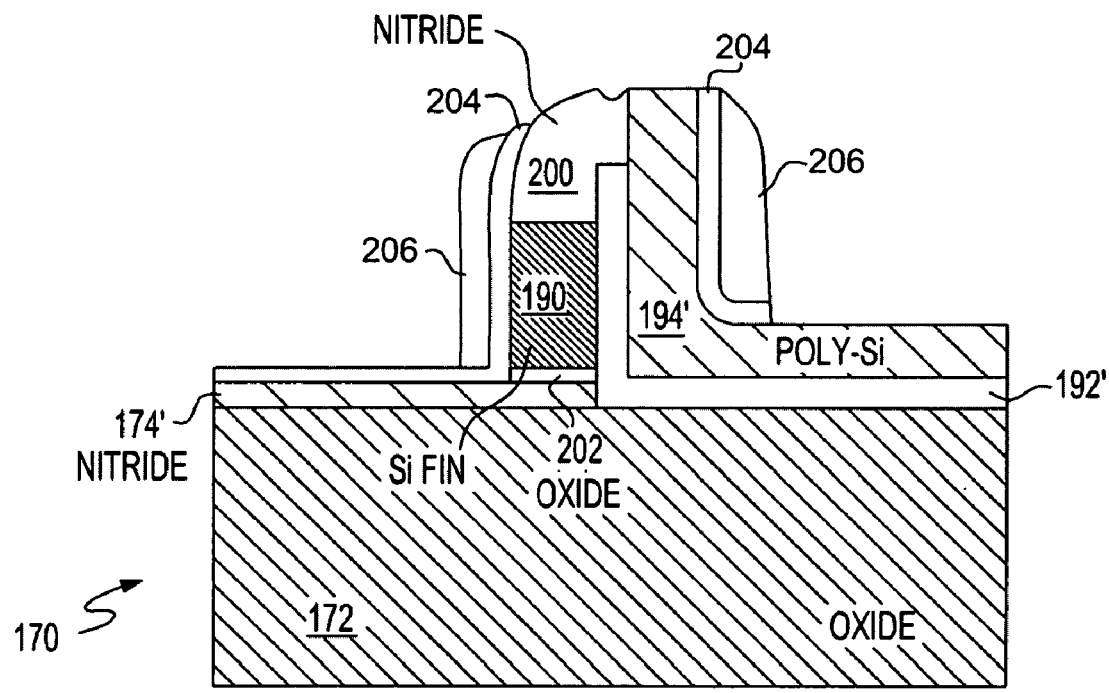
Figure 3J:
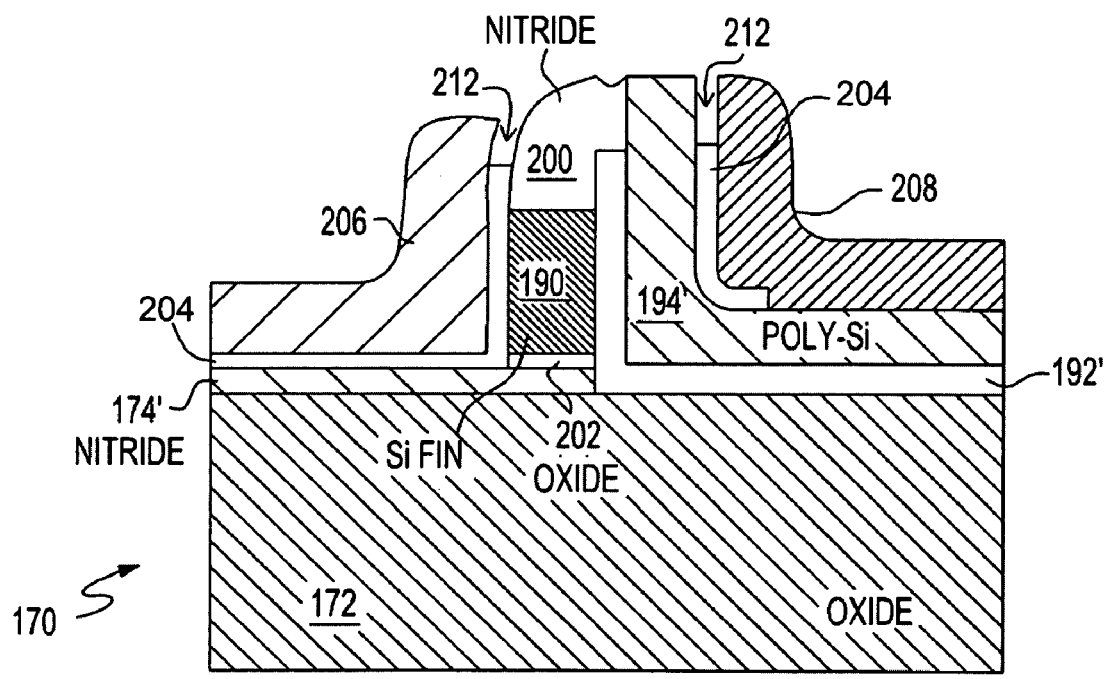
Figure 3K:
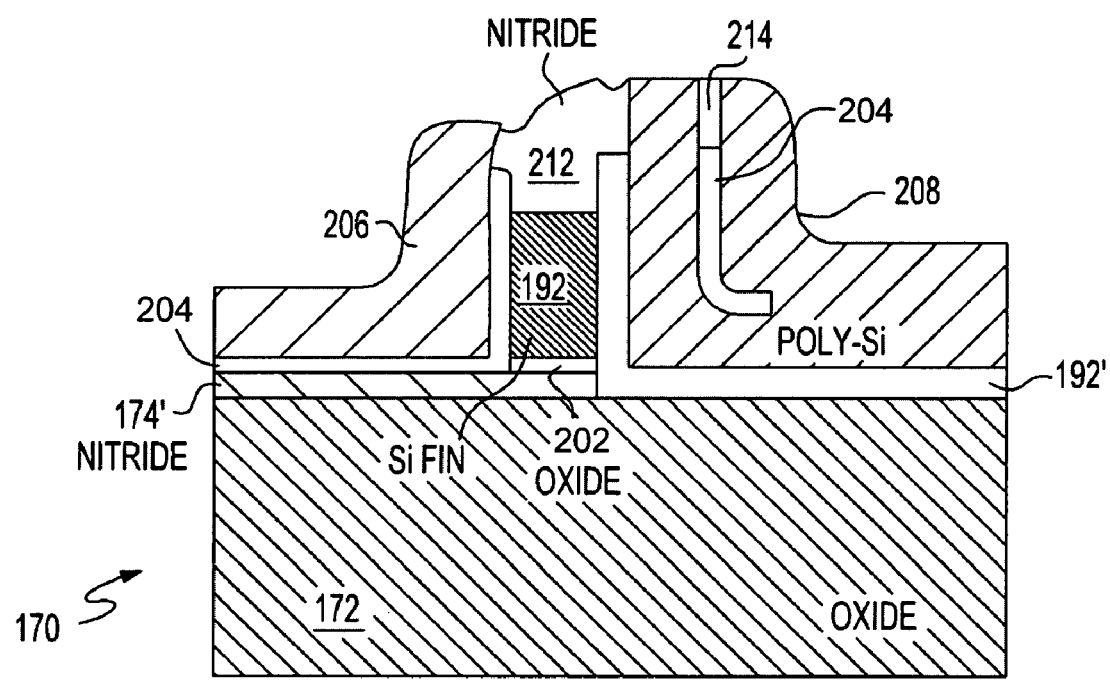

The device gate layer is formed in step 112, beginning in FIG. 3I by depositing a thin gate dielectric 204. A thin layer of gate material, e.g., polysilicon, is conformally deposited and isotropically etched away to remove horizontal portions with polysilicon spacers 206 remaining along either side of the fins 190. Next, in FIG. 3J a layer of conductive gate material (e.g., polysilicon) is deposited on the wafer. Then, using a typical photolithographic masking technique or, filling and planarizing with CMP as described hereinabove, the gate layer is patterned to define the polysilicon gates 206 and back bias gates 208. Exposed horizontal portions of the gate layer are removed, e.g., etched with a suitable etchant, separating device gates 206 from back bias gates 208. Preferably, voids 210 are also formed, e.g., etched, in the upper end of the gate dielectric 204. The voids 210 are plugged in FIG. 3K as nitride is deposited to fill the voids 210 and excess nitride is removed using a wet etch, for example, leaving the FinFETs capped 212 and leaving plugs 214. Thereafter, typical semiconductor processing steps are used to complete the chip or circuit.

It should be noted that the above described device materials are for example only and not intended as a limitation. In particular, the gate material (and correspondingly back bias gate material) may be may be polysilicon, a silicide, a metal or any suitable conductive material. Further, in one preferred embodiment device, the gate dielectric is an oxide and the back bias gate dielectric is a high K dielectric. Since most of the device current flow occurs at the device gate, gate oxide can provide a good interface for current flow, whereas a high K gate dielectric may impair mobility. Mobility is not an issue for the back bias gate and so, since the back bias gate is used for control purpose only, the back bias gate dielectric may be a high K dielectric.

Advantageously, dual gate FinFET formed according to the present invention have different thicknesses and may have different gate dielectrics because gate dielectrics for the device gate is formed separately and independently of back bias gate dielectrics. Further, back bias gates may be used for independently adjusting device threshold by applying a bias voltage that may be constant or time varying, depending upon device type, i.e., n-type FinFET or p-type FinFET. Further, time varying voltage can be used to allow dynamic threshold variation for preferred embodiment FinFETs. Thresholds can be increased for significantly reduced device leakage and reduced for performance, especially in large chip subunits; e.g., raising thresholds during dormant periods for reduced leakage (and reduced power consumption) and lowering threshold for higher drive current and better performance during active periods.

While the invention has been described in terms of preferred embodiments, those skilled in the art will recognize that the invention can be practiced with modification within the spirit and scope of the appended claims.

What is claimed is:

1. A field effect transistor (FET) comprising:
    a fin formed on a dielectric surface;
    a device gate along one side of said fin;
    a back bias gate along all opposite side of said fin;
    a device gate dielectric along one first side between said device gate and said fin; and
    a back bias gate dielectric along said opposite side between said back bias gate and said fin, wherein said back bias gate dielectric differs from said device gate dielectric in material, wherein one of said device gate dielectric and said back bias gate dielectric is a layered dielectric comprising at least 2 dielectric material layers.

2. A FET as in claim 1, wherein said back bias gate dielectric is thicker than said device gate dielectric.

3. A FET as in claim 1, wherein each of said back bias gate dielectric and said device gate dielectric is selected from a group of materials consisting of an oxide, an oxynitride and a high K dielectric.

4. A FET as in claim 1, wherein said device gate and said back bias gate are a conductive material selected from a group of materials consisting of a metal, doped silicon, doped germanium, doped silicon germanium and a metal silicide.

5. A FET as in claim 1, wherein said fin is a semiconductor fin selected from a group of materials consisting of silicon, germanium and silicon-germanium.

6. A FET as in claim 5, wherein said fin is a silicon fin.

7. A FET as in claim 6, wherein said dielectric surface is an oxide layer.

8. A WET as in claim 7, wherein said oxide layer is a buried oxide layer.

9. A FET as in claim 7, wherein said oxide layer is disposed on a nitride layer.

10. A FET as in claim 6, further comprising a dielectric pillar above said silicon fin.

11. A FET as in claim 10, wherein said dielectric pillar is a nitride pillar.

12. A FET as in claim 11, wherein said nitride pillar forms a cap between said device gate and said back bias gate.

13. An integrated circuit (IC) on a semiconductor on insulator (SOI) chip, said IC including a plurality of field effect transistors (FETs) disposed on an insulating layer, each of said FETs comprising:
    a semiconductor fin formed on an insulating layer;
    a device gate dielectric along a first side of said semiconductor fin;
    a device gate along said device gate dielectric;
    a back bias gate dielectric along an opposite side of said semiconductor fin; and
    a back bias gate along said back bias gate dielectric, wherein said back bias gate dielectric is five times (5×) thicker than said device gate dielectric.

14. An IC as in claim 13, wherein each of said back bias gate dielectric and said device gate dielectric is selected from a group of materials consisting of an oxide, an oxynitride and a high K dielectric.

15. An IC as in claim 13, wherein said gate and said back bias gate are a conductive material selected from a group of materials consisting of a metal, doped silicon, doped germanium, doped silicon germanium and a metal silicide.

16. An IC as in claim 13, wherein said dielectric surface is an oxide layer.

17. An IC as in claim 16, wherein said oxide layer is a buried oxide layer.

18. An IC as in claim 16, wherein said oxide layer is disposed on a nitride layer.

19. An IC as in claim 13, each said FET further comprising a dielectric pillar above said semiconductor fin.

20. An IC as in claim 19, wherein said semiconductor is silicon.

21. An IC as in claim 19, wherein said dielectric pillar is a nitride pillar.

22. An IC as in claim 21, wherein said nitride pillar forms a cap between said device gate and said back bias gate.

23. An integrated circuit (IC) on a semiconductor on insulator (SOI) chip, said IC including a plurality of field effect transistors (FETs) disposed on an insulating layer, each of said FETS comprising:
    a semiconductor fm formed on an insulating layer;
    device gate dielectric along a first side of said semiconductor fin;
    a device gate along said device gale dielectric;
    back bias gate dielectric along an opposite side of said semiconductor fin;
    a back bias gate along said back bias gate dielectric, wherein said back bias gate dielectric differs from said device gate dielectric in material, wherein one of said device gate dielectric and said back bias gate dielectric is a layered dielectric comprising at least 2 dielectric material layers.

24. An IC as in claim 23, wherein said device gate and said back bias gate are a conductive material selected from a group of materials consisting of a metal, doped silicon, doped germanium, doped silicon germanium and a metal suicide.

25. An IC as in claim 23, wherein said dielectric surface is an oxide layer.

26. An IC as in claim 25, wherein said oxide layer is a buried oxide layer.

27. An IC as in claim 25, wherein said oxide layer is disposed on a nitride layer.

28. An IC as in claim 23, each said FET further comprising a dielectric pillar above said semiconductor fin.

29. An IC as in claim 28, wherein said semiconductor is silicon.

30. An IC as in claim 28, wherein said dielectric pillar is a nitride pillar.

31. An IC as in claim 30, wherein said nitride pillar forms a cap between said device gate and said back bias gate.

* * * * *